Figure 1:
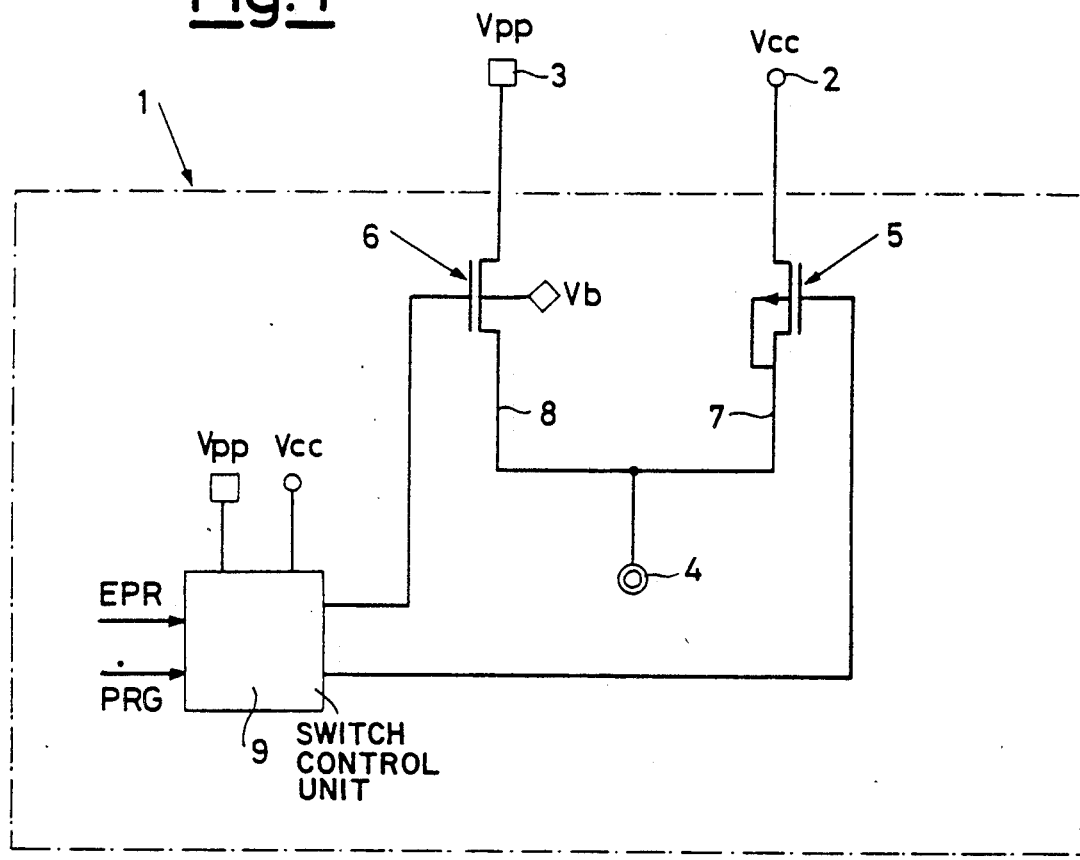

United States Patent [19]

Secol et al.

[11] Patent Number: 5,003,511
[45] Date of Patent: Mar. 26, 1991

[54] VOLTAGE SUPPLY SWITCHING DEVICE FOR NONVOLATILE MEMORIES IN MOS TECHNOLOGY

[75] Inventors: Maurizio Secol, Legnano; Maurizio Gaibotti, Barlassina, both of Italy

[73] Assignee: SGS-Thomson Microelectronics s.r.l., Milan, Italy

[21] Appl. No.: 274,886

[22] Filed: Nov. 22, 1988

[30] Foreign Application Priority Data

Dec. 1, 1987 [IT] Italy .................................. 22827 A/87

[51] Int. Cl.⁵ ...................... G11C 7/00; G11C 11/40; G11C 8/00
[52] U.S. Cl. .......................... 365/189.07; 365/189.09; 365/226; 307/296.8
[58] Field of Search ...................... 365/189.03, 189.07, 365/189.08, 189.09, 190, 226, 229, 189.11; 307/296.1, 296.5, 296.8

[56] References Cited

U.S. PATENT DOCUMENTS 4,565,960 1/1986 Takata et al. ................. 307/296.8 X
4,833,343 5/1989 Fuchs ............................ 307/296.8 X Primary Examiner—Alyssa H. Bowler
Attorney, Agent, or Firm—Sixbey, Friedman, Leedom & Ferguson

[57] ABSTRACT

Two P channel selection transistors are inserted in respective connecting circuit branches between two external pins with voltages Vcc and Vpp respectively and an internal node. A switching circuit controls said selection transistors. Circuit means are provided to hold the body bias of the selection transistors at a voltage equal to the highest voltage present from time to time at said external pins.

6 Claims, 4 Drawing Sheets

VOLTAGE SUPPLY SWITCHING DEVICE FOR NONVOLATILE MEMORIES IN MOS TECHNOLOGY

DESCRIPTION

The present invention relates to a voltage switching device for nonvolatile memories in CMOS technology.

In particular the invention is applicable to EPROM memories for switching an internal node between normal supply voltage (Vcc) and a higher programming voltage (Vpp) to perform programming or writing of the memory.

The invention also allows use of the programming pin, i.e. the pin normally designed to receive the programming voltage, for other purposes, e.g. as the input/output element in a microprocessor.

As known, an EPROM Memory receives part of the supply through an internal node which is alternately connected to a supply pin with voltage Vcc (5V) or a programming pin with voltage Vpp (12.5V) depending on whether the memory is subjected to reading, programming or writing.

For switching said internal node between one voltage and the other there is usually employed a switching device comprising two N channel selection transistors placed one on one and the other on the other of two circuit branches connecting two external pins with voltage Vcc and Vpp and the aforesaid internal node and a switching circuit assigned to control of said selection transistors.

To pilot the transistor placed on the branch which leads to the programming pin there is provided a voltage multiplier which allows application to the gate of said transistor of a voltage higher than Vpp.

This leads to circuit complexity and layout problems related to the voltage multiplier.

The object of the present invention is to accomplish a switching device for the above use which would not necessitate a voltage multiplier and would thus be much simpler to construct as compared with the known art.

Another object is to accomplish a switching device for the above use which would also allow the use of the programming pin for other purposes, e.g. as the input/output element in a microprocessor.

In accordance with the invention said objects are achieved by a switching device characterized in that the two selection transistors are the P channel type and there are provided circuit means for holding the body bias of said selection transistors at a voltage equal to the highest voltage present from time to time at the two external pins.

It appears clear that the use of P channel transistors pilotable in conduction with zero gate voltages in place of the N channel transistors (pilotable in conduction with positive gate voltages higher than the source voltage of said transistor) makes it possible to dispense with the voltage multiplier with the resultant advantages of circuit simplicity and layout.

At the same time the P channel transistors require their body to be held at a voltage equal to the highest voltage present in the circuit so as to prevent charge injections into the substrate. In the present case this problem is worsened by wishing to use the programming pin as an input/output element so that said pin is susceptible of accepting lower voltages equal to or higher than the supply voltage Vcc.

In accordance with the invention this problem is also solved by equipping the switching device with circuit means capable of holding the body bias of the P channel transistors at a voltage equal to the highest voltage from time to time present at the two external pins.

Figure 2:
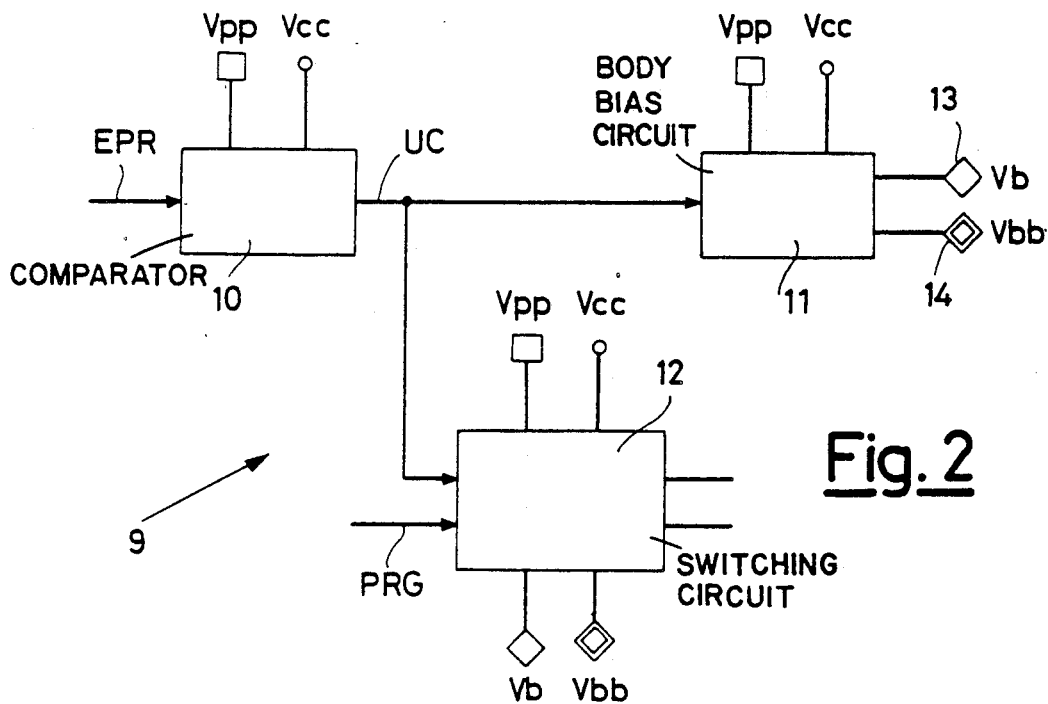
Figure 3:
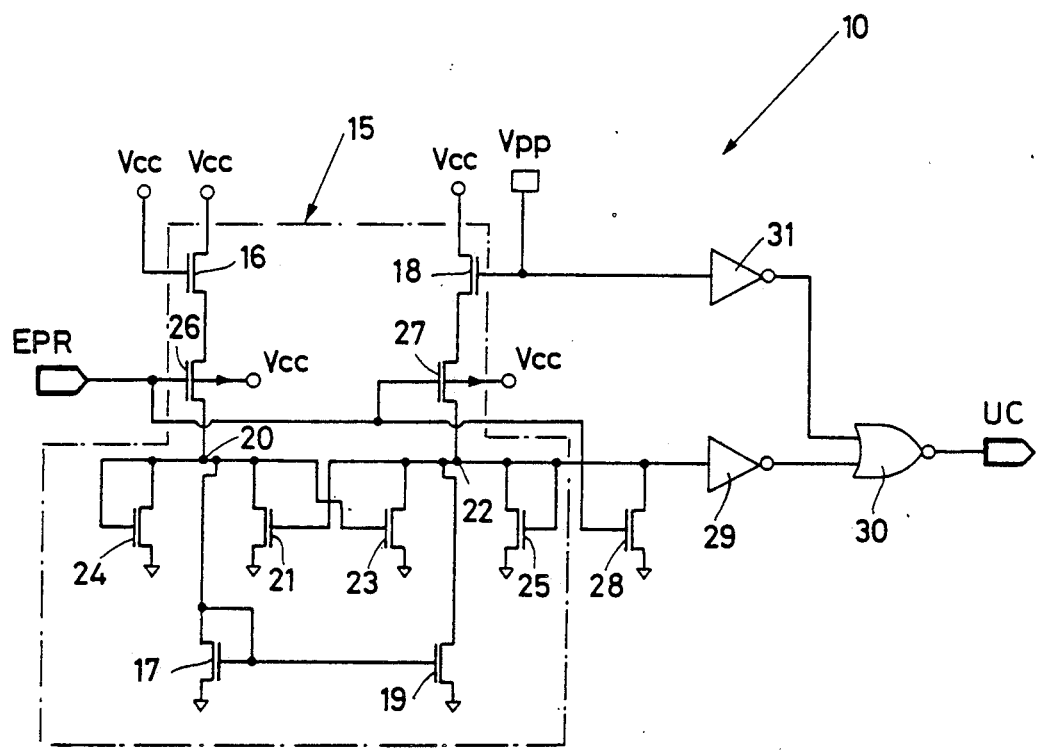
Figure 4:
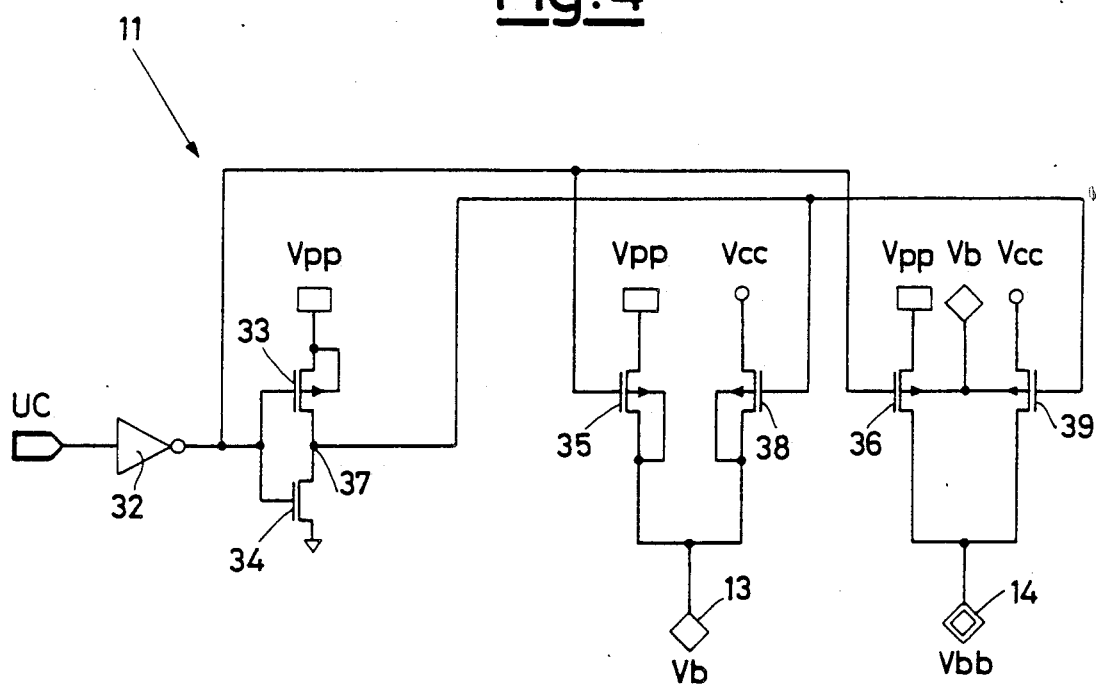
Figure 5:
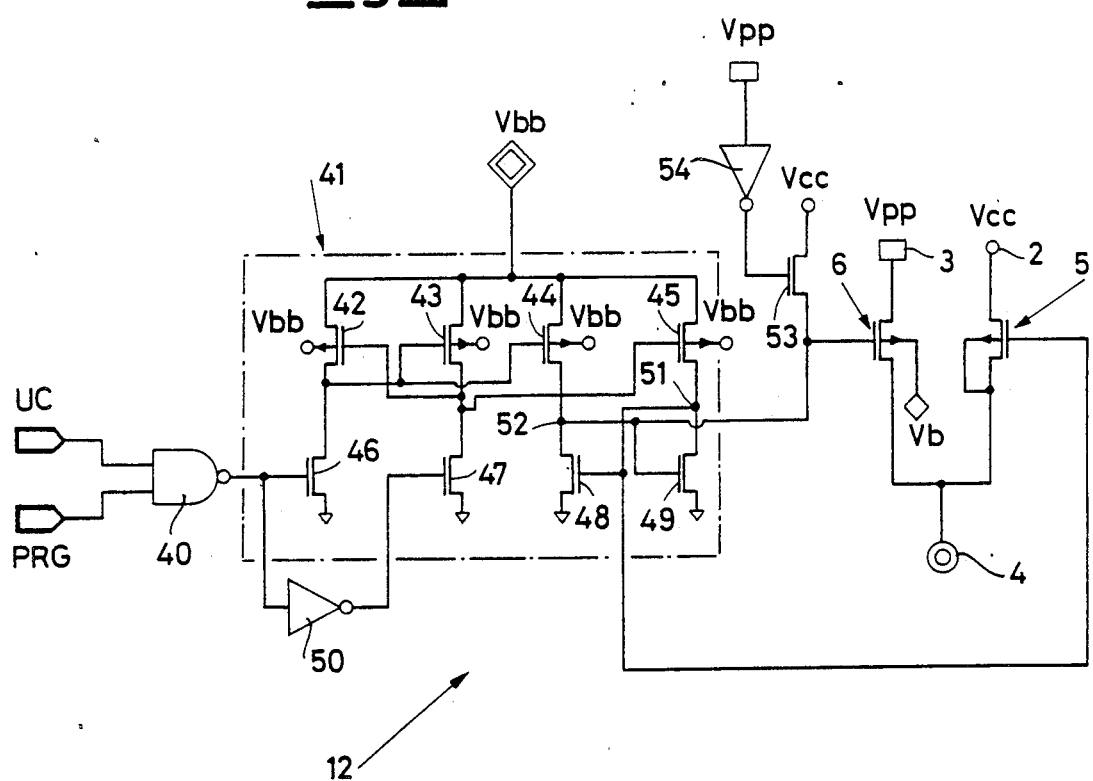

A practical embodiment of the present invention is illustrated for greater clarity and as an example in the annexed drawings wherein FIG. 1 shows in the most general terms the use of a switching device in accordance with the invention for voltage control in an internal node of an integrated circuit comprising a nonvolatile memory accomplished with CMOS technology, FIG. 2 shows a block diagram of the switching device in accordance with the invention, and FIGS. 3, 4 and 5 show the circuit details of the three blocks which make up the switching circuit of FIG. 2.

With reference to FIG. 1 reference number 1 indicates the switching device as a whole inserted in a single monolithic structure with a memory, e.g. EPROM (not shown), while reference numbers 2 and 3 indicate the external terminals or pins which carry the normal supply voltage Vcc and the programming voltage Vpp respectively and reference number 4 indicates the internal node selectively switchable to one or the other of the two voltages.

As shown in FIG. 1 the switching device comprises two P channel selection transistors 5 and 6 each of which is inserted in one of the two circuit branches 7 and 8 respectively which connect the supply terminals 2 and 3 to the internal node 4.

The gate terminals of the two transistors 5 and 6 are piloted by a switching control unit 9 which also receives the two supply voltages Vcc and Vpp and is subjected to two control signals PRG and EPR which will be explained below.

A block diagram of the switching control unit 9 is shown in FIG. 2 where it is seen to comprise an analog comparator 10, a body bias circuit 11 for the P channel transistors and a switching circuit 12 to control the switching of the selection transistors 5 and 6.

All the above circuits 10, 11 and 12 receive the two supply voltages Vcc and Vpp. The comparator 10 compares them and emits a digital output signal UC whose high or low logic level indicates whether Vpp is higher or lower than Vcc. It also holds its output signal level low each time it receives the EPR signal indicating the intention to use the programming pin 3 as the input/output element or other. Depending on the logic level of the output UC of the comparator 10 the bias circuit 11 makes available at its output terminals 13 and 14 two bias voltages Vb and Vbb which are the same and are equal to the voltage from time to time higher of the two supply voltages Vcc and Vpp. The switching circuit 12, which also receives the two bias voltages Vb and Vbb, performs switching control of the two transistors 5 and 6 on the basis of the logic level of the output signal UC of the comparator 10 and under the general control of the programming signal PRG coming from the general control unit of the integrated circuit (not shown).

The analog comparator 10 is illustrated in its circuit details in FIG. 3 where it is seen to comprise a comparison stage 15 formed of a first circuit branch including two N channel transistors 16 and 17 in series between the supply Vcc and ground and a second circuit branch including two N channel transistors 18 and 19 also in series between the supply Vcc and ground. The transistor 16 is gate piloted with the Voltage Vcc while the transistor 18 is gate piloted with the voltage Vpp. The two transistors 17 and 19 have a common gate connected to the source of the transistor 17. An intermediate node 20 between the transistors 16 and 17 is connected to ground through an N channel transistor 21 which has its gate connected to an intermediate node 22 between the transistors 18 and 19. The node 22 is also connected to ground through an N channel transistor 23 which has its gate connected to the node 20. The two nodes 20 and 22 are also connected to ground through respective N channel transistors 24 and 25 whose gate terminals are connected to respective drain terminals.

Between the transistors 16 and 18 and the circuit nodes 20 and 22 are placed respective P channel transistors 26 and 27 with the body connected to Vcc, whose gate terminals are capable of receiving the EPR signal. The same thing takes place for an N channel transistor 28 placed between the circuit node 22 and ground.

An inverter 29 is placed between the circuit node 22 and an input of an NOR port 30 whose other input is connected to the output of an inverter 31 which receives the programming voltage Vpp.

The digital output signal UC of the analog comparator 10 is made available at the output of the NOR port 30.

The body bias circuit 11 is illustrated in detail in FIG. 4 and comprises an inverter 32 which has its input connected to the output UC of the comparator 10 and its output connected to the gate terminal of a P channel transistor 33 with the body connected to the source and of an N channel transistor 34, said transistors 33 and 34 being connected in series between a voltage supply terminal Vpp and ground. The output of the inverter 32 is also connected to the gate terminal of a P channel transistor 35 with body connected to the drain placed between the terminal with voltage Vpp and the bias terminal 13 (voltage Vb) This is connected to the gate terminal of a P channel transistor 36 with body connected to the voltage bias terminal Vb placed between the terminal with voltage Vpp and the bias terminal 14 (voltage Vbb).

An intermediate node 37 between the transistors 33 and 34 is in turn connected to the gate terminal of a P channel transistor 38 with body connected to the drain placed between the terminal with voltage Vcc and the bias terminal 13, as it is also connected to the gate terminal of a P channel transistor with body connected to Vb, which is placed between the terminal with voltage Vcc and the bias terminal 14.

The switching circuit 12 illustrated in detail in FIG. 5 comprises an NAND port 40 to the inputs of which are applied the output signal UC of the comparator 10 and the programming signal PRG. The output signal of the NAND port 40 is applied to the input of a voltage translator 41 which has the task of supplying the desired control voltages to the gate terminals of the selection transistors 5 and 6.

The voltage translator 41 comprises four P channel transistors 42-45 with body connected to Vbb and which are placed on four parallel circuit branches between Vbb and ground and in series with respective N channel transistors 46-49. The transistors 42 and 45 have their gate terminals connected to intermediate nodes between the transistors in series 43 and 47 while the transistors 43 and 44 have their gate terminals connected to an intermediate node between the transistors in series 42 and 46. The transistors 46 and 47 have their gate terminals connected to the output of the NAND port 40 directly and through the inverter 50 respectively. The transistor 48 has its gate terminal connected to an intermediate node 51 between the transistors 45 and 49 as well as to the gate of the selection transistor 5 which has its body connected to the drain. The transistor 49 has the gate terminal connected to an intermediate node 52 between the transistors 44 and 48 as well as to the gate of the selection transistor 6 which has its body connected to Vb.

Finally the switching circuit 12 comprises an N channel transistor 53 placed between Vcc and the gate of the selection transistor 6. The gate of the transistor 53 is controlled by the voltage Vpp through an inverter 54.

Due to the effect of the described structure the switching device illustrated as an example in the drawings is designed to operate in the following manner.

The analog comparator 10 (FIG. 3) continually compares Vcc (always 5V) with Vpp (12.5V in the programming phase and 5V in the reading phase).

When Vpp is higher than Vcc as in the programming phase the transistor 18 conducts more than the transistor 16 so that the circuit node 22 of the comparison stage 15 rises to a high level voltage and, through the inverter 29 and the NOR port 30, originates a high level output UC.

When Vpp is equal to or lower than Vcc as in the reading phase the transistor 16 conducts more than the transistor 18 so that the circuit node 22 falls to a low level with resulting similar fall of the output signal UC.

Basically therefore UC is high level if Vpp is higher than Vcc and low level if not.

This latter situation also occurs when it is desired to use the programming pin 3 for purposes other than memory programming. In this case the EPR signal turns off the P channel transistors 26 and 27 and conduction of the N channel transistor 28 so that the circuit node 22 falls to low level and causes a similar fall of the output UC of the comparator. Current consumption for this use is thus small.

Through the inverter 31 and the NOR port 30 it is possible to obtain an immediate fall of the level of the output signal UC in case of a sudden fall of voltage Vpp due for example to breaking of the supply circuit.

The voltage level of the output signal UC of the comparator 10 is used by the body bias circuit 11 and the switching circuit 12.

The body bias circuit 11 (FIG. 4) uses it specifically to hold at the highest voltage available, Vpp or Vcc, body bias of all the P channel transistors which might have source and drain bias higher than body bias. As is known this is essential to prevent charge injections into the substrate.

When UC is at high level indicating that Vpp is higher than Vcc, i.e. the memory is in the programming phase, the gate terminals of the P channel transistors 35 and 36 are low level so that said transistors conduct and transfer to the terminals 13 and 14 the voltage Vpp, i.e. creating bias voltages Vb and Vbb equal to Vpp. At the same time the transistors 38 and 39 are turned off, the circuit node being at high level due to the effect of the conduction of the P channel transistor 33 and turning off of the N channel transistor 34 caused by the low level applied to their gate terminals. In this situation all the P channel transistors have their body at voltage Vpp, i.e. at the highest voltage present at that moment in the circuit.

When UC is low level, indicating that Vpp is lower than or equal to Vcc, i.e. the reading phase prevails or the programming pin 3 is used for other purposes or there is a sudden fall of the voltage Vp, the gate terminals of the transistors 35 and 36 are at high level so that said transistors are extinguished while the transistors 38 and 39 conduct, the circuit node 37 being at low level due to the effect of the conduction of the transistor 34 and of extinction of the transistor 33. At the terminals 13 and 14 there are therefore present bias voltages Vb and Vbb equal to Vcc. In this situation all the P channel transistors have their body at voltage Vcc, i.e. at the highest voltage present in the circuit at that moment.

As already mentioned the voltage level of the output UC of the comparator is also used by the switching circuit 12 (FIG. 5). Said signal is combined with the signal PRG at the NAND port 40 so as to enable said signal PRG to control the alternate switching of the selection transistors 5 and 6 and hence application to the internal node 4 of the voltage Vcc (in memory reading phase or for uses of the pin 3 other than programming of said memory) or of the voltage Vpp (in the programming phase of the memory) depending on the voltage level of the output UC and hence based on the voltage Vpp present at the pin 3. It should be noted that the bias voltages Vb and Vbb generated by the bias circuit 11 ensure the desired body bias at the highest voltage level present in the circuit to the various P channel transistors shown in FIG. 5.

The high level UC signal allows the programming signal PRG to control for the internal node 4 selection of the programming voltage Vpp which said signal UC indicates at that moment as being higher than Vcc and hence suitable for programming the memory. With the two high level signals UC and PRG the output of the NAND port 40 goes to low level and through the voltage translator 41 causes application of a voltage 0 to the gate of the selection transistor 6 and of a voltage equal to Vbb (i.e. Vpp i.e. 12.5V) to the gate of the other selection transistor 5. Hence the latter is open while the former conducts and transfers the programming voltage Vpp to the internal node 4.

In this situation the inverter 54 and the transistor 53 have the task of immediately turning off the transistor 6 in case of a sudden fall of the voltage Vpp.

Again with the signal UC at high level the programming signal PRG can also control transfer of the voltage Vcc instead of Vpp to the internal node 4. In this case the translator circuit 41 applies a voltage 0 to the gate of the transistor 5 and a voltage equal to Vbb (i.e. Vpp i.e. 12.5V) to the gate of the transistor 6. The latter is thus turned off while the former conducts and transfers the voltage Vcc to the internal node 4.

The low level signal UC, indicating the absence of a suitable programming voltage Vpp equal to 12.5V, whether because the reading phase prevails or because the pin 3 is being used for purposes other than programming or because power has suddenly been removed, blocks the output of the NAND port 40 at high level, disabling the programming signal PRG and causing through the voltage translator circuit 41 application of a voltage 0 to the gate of the selection transistor 5 and a voltage equal to Vbb (i.e. Vcc i.e. 5V) to the gate of the selection transistor 6. The latter is thus turned off while the former conducts and transfers the supply voltage Vcc to the internal node 4.

We claim:

1. A voltage supply switching device for nonvolatile memories in CMOS technology comprising two selection transistors inserted in respective circuit connection branches between two external pins with voltage Vcc and Vpp respectively and an internal node and a switching circuit controlling said selection transistors, wherein said selection transistors are the P channel type and there are provided circuit means to hold the body bias of said selection transistors at a voltage equal to the highest voltage from time to time present at said external pins;

said device further comprising an analog comparator to compare to said voltages Vcc and Vpp and generate an output signal at two voltage levels depending upon the result of said comparison;

said circuit means comprising at least one pair of P channel bias switching transistors inserted in respective connecting circuit branches between terminals with voltage Vpp and Vcc at a bias terminal for production of the bias voltage (Vb, Vbb) and means sensitive to the voltage level of the output signal of the comparator which control said bias switching transistors in such a manner as to transfer to said bias terminal the voltage, Vpp or Vcc, which said output signal indicates to be higher than the other.

2. Device in accordance with claim 1 characterized in that said circuit means comprise two pairs of said bias switching transistors for production of equal bias voltages, one for the body bias of the P channel transistors of said circuit means and one of said selection transistors and the other for body bias and supply of the P channel transistors of said switching circuit, the other of said selection transistors having the body biased by said internal node.

3. The device according to claim 1, wherein said analog comparator also comprises an input for a signal for the forced switching of said output signal to the voltage level corresponding to a voltage Vpp lower than Vcc.

4. A voltage supply switching device for non-volatile memories in CMOS technology comprising two selection transistors inserted in respective circuit connection branches between two external pins with voltage Vcc and Vpp respectively and an internal node and a switching circuit controlling said selection transistors, wherein said selection transistors are the P channel type and there are provided circuit means to hold the body bias of said selection transistors at a voltage equal to the highest voltage from time to time present at said external pins;

said device further comprising an analog comparator to compare to said voltages Vcc and Vpp and generate an output signal at two voltage levels depending upon the result of said comparison;

said switching circuit comprising means for combination of said output signal of the analog comparator with a programming signal indicating the voltage switching at the internal node required by the memory operating program and means for converting the result of said combination into control signals for said selection transistors.

5. Device in accordance with claim 4 characterized in that said switching means comprise a voltage translator supplied with said bias voltage.

6. The device according to claim 4, wherein said analog comparator also comprises an input for a signal for the forced switching of said output signal to the voltage level corresponding to a voltage Vpp lower than Vcc.

* * * * *

UNITED STATES PATENT AND TRADEMARK OFFICE
CERTIFICATE OF CORRECTION

PATENT NO. : 5,003,511

DATED : March 26, 1991

INVENTOR(S) : Maurizio SECOL et al.

It is certified that error appears in the above-identified patent and that said Letters Patent is hereby corrected as shown below: Title page:

[73] Assignee: SGS-Thomson Microelectronics s.r.l., Agrate Brianza Milano, Italy Signed and Sealed this Twelfth Day of January, 1993

Attest:

DOUGLAS B. COMER

Attesting Officer

Acting Commissioner of Patents and Trademarks